United States Patent
T. Kunasekaran et al.

(10) Patent No.: US 11,259,443 B1
(45) Date of Patent: Feb. 22, 2022

(54) HEAT RESISTANT RFID TAGS

(71) Applicant: SMARTRAC Investment B.V., Amsterdam (NL)

(72) Inventors: Syamala Gauri T. Kunasekaran, Kulim (MY); Muthuk Kumaran Subramaniam, Kulim (MY)

(73) Assignee: SMARTRAC INVESTMENT B.V., Amsterdam (NL)

(*) Notice: Subject to any disclaimer, the term of this patent is extended or adjusted under 35 U.S.C. 154(b) by 9 days.

(21) Appl. No.: 16/298,208

(22) Filed: Mar. 11, 2019

(51) Int. Cl.
*H05K 7/20* (2006.01)
*G06K 19/07* (2006.01)

(52) U.S. Cl.
CPC ....... *H05K 7/2039* (2013.01); *G06K 19/0723* (2013.01)

(58) Field of Classification Search
CPC ............ H05K 7/2039; H05K 2201/02; H05K 2201/0275; G06K 19/0723; Y10S 264/19; Y10S 264/913; Y10S 384/911; B32B 2315/085; D10B 2101/00; D10B 101/20; D10B 101/02; D10B 101/06; H04W 4/80; H04W 12/009; H04W 12/47
See application file for complete search history.

(56) References Cited

U.S. PATENT DOCUMENTS

| 8,430,987 | B2* | 4/2013 | Simons | G06K 19/027 156/247 |
| 9,159,015 | B2* | 10/2015 | Bielmann | H01Q 1/2225 |
| 2005/0146403 | A1* | 7/2005 | Okubora | H01L 23/49833 333/247 |
| 2008/0218416 | A1* | 9/2008 | Handy | H01Q 21/065 343/700 MS |
| 2009/0085182 | A1* | 4/2009 | Yamazaki | H01L 23/295 257/679 |
| 2010/0259393 | A1* | 10/2010 | Marur | G06K 19/07749 340/572.8 |
| 2011/0017832 | A1* | 1/2011 | Ritamaki | G06K 19/07745 235/492 |
| 2011/0027520 | A1* | 2/2011 | Lauterbach | E04F 15/12 428/76 |
| 2012/0164405 | A1* | 6/2012 | Webb | D03D 1/0011 428/196 |
| 2013/0061970 | A1* | 3/2013 | Green | B32B 27/08 138/99 |
| 2014/0015643 | A1* | 1/2014 | Shankman | G06K 19/0723 340/10.1 |
| 2015/0278671 | A1* | 10/2015 | Martin | G06K 19/027 235/492 |
| 2015/0364824 | A1* | 12/2015 | Song | D02G 3/441 343/700 MS |
| 2016/0052240 | A1* | 2/2016 | Sargeant | B32B 7/12 442/1 |
| 2016/0119456 | A1* | 4/2016 | Godfrey | H04M 1/0202 455/575.8 |
| 2016/0355045 | A1* | 12/2016 | Ivester | B42D 25/387 |
| 2016/0379103 | A1* | 12/2016 | Chou | G06K 19/0773 235/492 |

(Continued)

*Primary Examiner* — Michael A Matey
(74) *Attorney, Agent, or Firm* — Quarles & Brady LLP (57) ABSTRACT

Heat resistant RFID tags can be formed by embedding RFID tags between laminates of glass fiber meshes. The glass fiber meshes can be woven tightly. Air gaps between the glass fibers can be filled with a high temperature adhesive. Mica sheets can be used with the glass fiber meshes.

10 Claims, 9 Drawing Sheets

(56) References Cited

U.S. PATENT DOCUMENTS

| | | | |
|---|---|---|---|
| 2017/0262748 A1* | 9/2017 | Lettow | G06K 19/07773 |
| 2017/0277992 A1* | 9/2017 | Janko | C09J 9/00 |
| 2018/0169917 A1* | 6/2018 | Chang | G06K 19/07724 |
| 2018/0311929 A1* | 11/2018 | Mason | B32B 7/022 |
| 2019/0012589 A1* | 1/2019 | Ma | G06K 19/07754 |
| 2019/0017879 A1* | 1/2019 | Sullivan | A41D 1/002 |
| 2019/0057289 A1* | 2/2019 | Bauer | G09F 3/0297 |
| 2019/0099859 A1* | 4/2019 | Jayaram | B24D 18/0072 |
| 2019/0228280 A1* | 7/2019 | Zanesi | B32B 3/08 |
| 2019/0266465 A1* | 8/2019 | Uijlenbroek | G06K 19/025 |
| 2019/0329583 A1* | 10/2019 | Herrington | G06K 19/07722 |
| 2019/0334223 A1* | 10/2019 | Fang | G06K 19/07783 |
| 2019/0376212 A1* | 12/2019 | Bryant | D03D 11/00 |
| 2020/0032012 A1* | 1/2020 | Kang | C08J 3/122 |
| 2020/0048503 A1* | 2/2020 | Kathal | B32B 27/32 |
| 2020/0071927 A1* | 3/2020 | Ohgi | F16L 59/02 |

* cited by examiner

HEAT RESISTANT RFID TAGS

This invention relates generally to radio frequency identification (RFID) tags, and more specifically, to heat resistant RFID tags to processes for producing heat resistant RFID tags.

BACKGROUND

Radio frequency identification (RFID) tags are well known for tracking items, for example, by being responsive to a radio frequency signal for transmitting a response signal. An RFID tag is an electrical device, generally including an antenna connected to an integrated circuit. The RFID tags can be encapsulated to protect the RFID tags from mechanical and thermal damages.

Due to the popularity of the RFID technology, there are more and more demands for special types of packaging, for example, in different ambient such as a high temperature environment.

Thus, there is a need to provide an RFID tag with a high resistance to temperature variations with low cost manufacturability, e.g., easily adapted to the current RFID tag manufacturing.

SUMMARY

In some embodiments, the present invention discloses heat resistant RFID tags, and methods to form heat resistant RFID tags. Meshes of inorganic fibers, such as glass fibers, can be used on one or two sides of the RFID tags, which can protect the RFID tags in a heated environment. The inorganic fibers can be weaved tightly to prevent heat flux. Alternatively, gaps in the fiber meshes can be filled with a high temperature adhesive, such as a polymer-based adhesive for medium high temperature applications, or an inorganic-based adhesive, e.g., cement adhesives, for high temperature applications. In addition, inorganic sheets, such as mica sheets, can be used with the fiber meshes.

DETAILED DESCRIPTION OF THE EMBODIMENTS

Radio frequency identification (RFID) tags can be used in non-contact type automatic identification technique. For example, an RFID tag is attached to an object and communicates with an RFID reader through transmission and reception of signals using a radio frequency in order to automatically identify the object using wireless radio waves.

There are different types of RFID tags, with different operating principles and/or functionalities, for example, active and passive tags, tag reading only and tag read/write. Read only capability allows the identification of the object, for example, an inventory of objects in a warehouse, or identifications and locations of objects in an automatic manufacturing cycle. Read/write capability can be used in electronic card applications, such as smart cards, which need a read/write feature in order to modify the contents according to the consumption of the user.

The RFID tag typically includes an antenna and an electronic chip. The electronic chip provides the functionality, and the antenna provides the communication with a remote reader. The antenna can also produce the necessary energy to feed the electronic chip through the signal received from the reader, as in the case of passive RFID tags. Such tags are intended to be applied to a very large number of objects, for example to shipping boxes, to the individual items in a store, or to credit cards or smart cards.

Figure 1A:
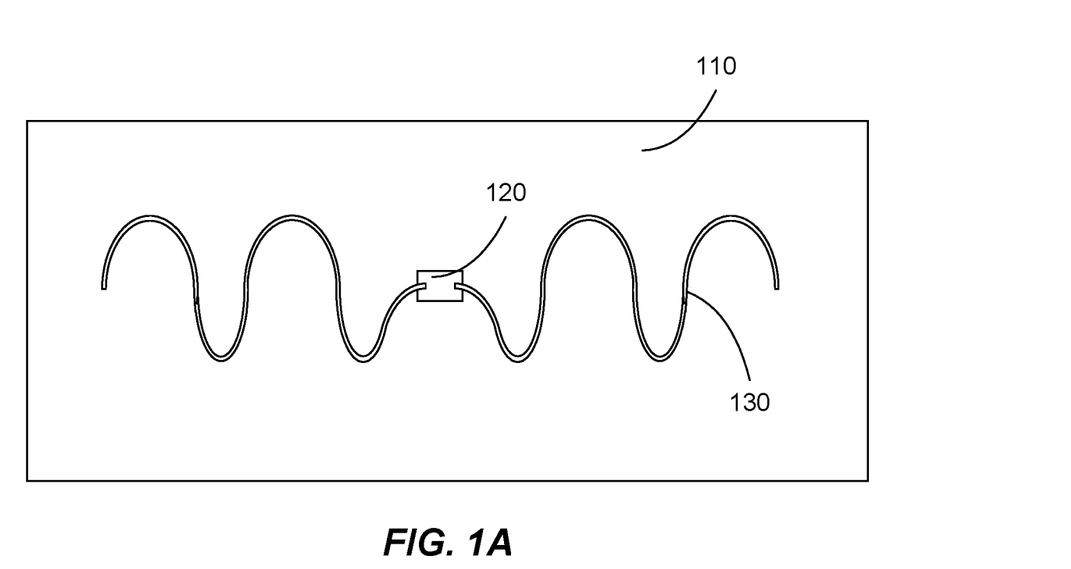
FIGS. 1A-1B illustrate an RFID configuration according to some embodiments.
Figure 1B:
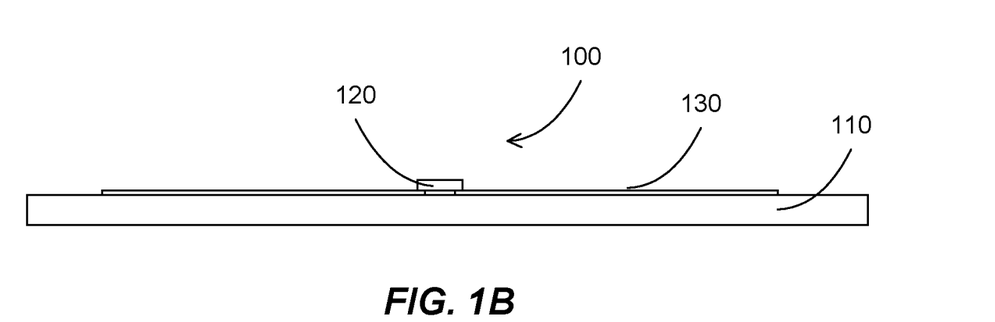

FIGS. 1A-1B illustrate an RFID configuration according to some embodiments. An RFID tag 100 can include an electronic chip 120, e.g., an integrated circuit, coupled to an antenna 130. The RFID tag can also include an optional substrate 110, on which the electronic chip and the antenna is adhered to. The RFID tag can be flexible, e.g., the electronic chip can be small, coupled to a flexible antenna, and mounted on a flexible substrate.

The RFID tags are packaged in different forms, with the thin flat configuration is the most common. The RFID tags are also configured to be coupled to objects by different means, typically by gluing the packaged RFID tags onto a surface of the objects. The tags are normally encapsulated for durability against shock, fluids, dust or dirt. In some embodiments, the RFID tags are also encapsulated to protect the RFID tags in high temperature environments.

The requirements for heat protection of the RFID tags can include a high heat insulation encapsulation, e.g., the temperature difference between the side facing the heat source and the side facing away from it should be as high as possible. The high heat insulation can be selected based on the temperature difference, e.g., between a typical operating temperature of the RFID tags, which is typically below 50-80 C, and the maximum working temperature of the RFID tags, such as about 200-300 C for typical light industry high temperature applications, about 500-600 C for typical industrial high temperature applications, and about 1000-1200 C for plasma, welding or furnace applications. For example, heat resistant RFID tags can be used in marking of vehicle parts that can be subjected to oven bake with multiple thermal cycling at 200 C in painting processes.

The requirements can include a form factor for the RFID tags, e.g., the heat resistant RFID tags should be compact, e.g., having small sizes, because tracking objects can be placed close to each other in modern machinery, for example. Further, the manufacturing processes and the costs of the RFID tags should be adequate and acceptable in corresponded industries.

In some embodiments, the present invention discloses systems and methods for protect RFID tags from a high temperature environment, using high temperature, high strength inorganic fiber meshes, such as glass fiber meshes.

In some embodiments, the present invention discloses heat resistant RFID tags, and methods to form heat resistant RFID tags. Meshes of inorganic fibers can be used on one or two sides of the RFID tags, which can protect the RFID tags in a heated environment. The inorganic fibers can be weaved tightly to prevent heat flux. Alternatively, gaps in the fiber meshes can be filled with a high temperature adhesive, such as a polymer-based adhesive for medium high temperature applications, or an inorganic-based adhesive, e.g., cement adhesives, for high temperature applications. In addition, inorganic sheets, such as mica sheets, can be used with the fiber meshes.

The RFID tags can be applied on different surfaces of objects. In some embodiments, the RFID tag has a small overall height, such as a thin label to be applied in or on card objects, such as smart cards or credit cards. In some embodiments, the RFID tag can include an antenna coupled to an RFID chip. In some embodiments, the RFID tag can include an antenna coupled to an RFID chip on a carrier or a substrate. The term RFID relates to radio frequency identification, but in the context of the present invention, comprises wireless communication, including all frequency transmission.

To apply the RFID tags on objects that can be exposed to a high temperature, such as cookware objects to be used in a microwave, a welding component in a welding process, or an object on a furnace, heat protection of the RFID tags can be necessary, for example, to ensure the functionality of the RFID tag after being exposed to a temperature exceeding the damaging temperature of the RFID tags, such as higher than about 50-80 C for the electronic chip, or higher than 80-150 C for the thin antenna or the inlay substrate.

In some embodiments, the present invention discloses a laminate of an inorganic fiber mesh, such as a glass fiber mesh, to protect the RFID tags. The laminate can also include fillers or one or more layers of high temperature materials, such as inorganic sheets or inorganic cement adhesive.

The RFID tag can include at least one electronic component and a generally flat antenna assembled on a generally planar substrate, to be read by a reader which transmits an electromagnetic field towards the RFID component. The fiber mesh laminate can be disposed on the substrate, on the opposite side of the RFID tag, to prevent a heat flux from the substrate side. Alternatively, the fiber mesh laminate can replace the substrate, e.g., the RFID tag can be attached to the fiber mesh laminate without a need for the substrate. The fiber mesh laminate can cover both sides of the substrate with the RFID tag embedded within the fiber mesh laminate. This configuration can protect the RFID tag from all sides.

In some embodiments, the fiber mesh laminate is in the form of a sheet at about the same size as the antenna. Alternatively, the laminate can be larger than the antenna, creating an edge effect to protect the antenna. The laminate can be directly placed under the antenna or with an intermediate layer.

The RFID tag can be embedded in a high temperature adhesive or encapsulated between two protection sheets of fiber mesh laminate. Additional layers can be used, such as high temperature adhesive layers or mica sheets. In some embodiments, the heat protection RFID tag can be less than a few mm, or can be less than 1 mm.

In some embodiments, the laminate can include one or more layers having different thermal responses. For example, the RFID tag is applied on a fiber mesh layer with a high compression property which is disposed on a thin flexible mica layer with a low compression property. The RFID tag on the layers is then applied on the surface of the object, with the layers facing outward to protect the RFID tag from high temperature environment. Additionally or alternatively, an adhesive layer can be placed between the layers or between the layers and the RFID tag to bond these components together.

In some embodiments, the inorganic fibers can include glass fibers, carbon fibers, silicate fibers, ceramics fibers, aluminum silicate fibers, basalt fibers and mixtures thereof. In some embodiments, small amounts of organic fibers can be contained in the inorganic fibers. For example, the organic fiber amount can be less than 20%, or less than 10% of the total fiber contents. The fiber mesh can include woven fiber mesh, knitting fiber mesh, knitted fiber mesh, structure fiber mesh or non-crimp fiber mesh.

The glass fibers can be both stiff and strong along the axis, while weak across the axis. Thus a mesh of glass fibers arranged in different directions, such as in perpendicular directions, can prevent the glass fiber mesh, or a sheet formed with a glass fiber mesh having the air gaps between the fibers filled with a high temperature adhesive or cement, from bucking or crumbling in a high temperature environment.

The glass fibers can include silicon dioxide glass, alumino-borosilicate glass with less than 1% by weight of alkali oxides, alkali-lime glass without or with a small amount of boron oxide), alumino-lime silicate with less than 1% by weight of alkali oxides, alkali-lime glass with high boron oxide content, borosilicate glass, alumino silicate glass, or alumino silicate glass.

In some embodiments, the fiber meshes can be arranged in one mesh layer, or multiple layers, e.g., placing the fiber meshes on top of each other. The sheets of fiber meshes can have an increase in overall strength, with the flexibility or stiffness of the fiber sheets efficiently controlled. For example, using short fiber length, e.g., chopped strand materials, the strength directionality can be essentially the entire two dimensional plane. Using woven fiber mesh, or unidirectional fiber arrangements, the directionality of stiffness and strength can be controlled within the plane.

In some embodiments, a sheet of glass fiber mesh can have a fiber mesh reinforcement shell, with the air gaps between the fibers filled with a high temperature adhesive or cement. The sheet can be constructed to remove all air gaps, such as placing the sheet under pressure for thinning the sheet. Additional layers of mica sheet, high temperature adhesive or cement can be applied to one side or both sides of the sheets, for example, to increase the thermal insulation characteristic.

In some embodiments, the high temperature adhesive can include polymeric adhesive with operating temperatures of less than 500 C, or less than 300 C. The high temperature adhesive can include high temperature inorganic, ceramic or graphite adhesives, for example, using fillers or binders such as $Al_2O_3$, AlN, $Al_2O_3$—$SiO_2$, MgO, mica, $SiO_2$, $ZrO_2$, SiC.

Figure 2A:
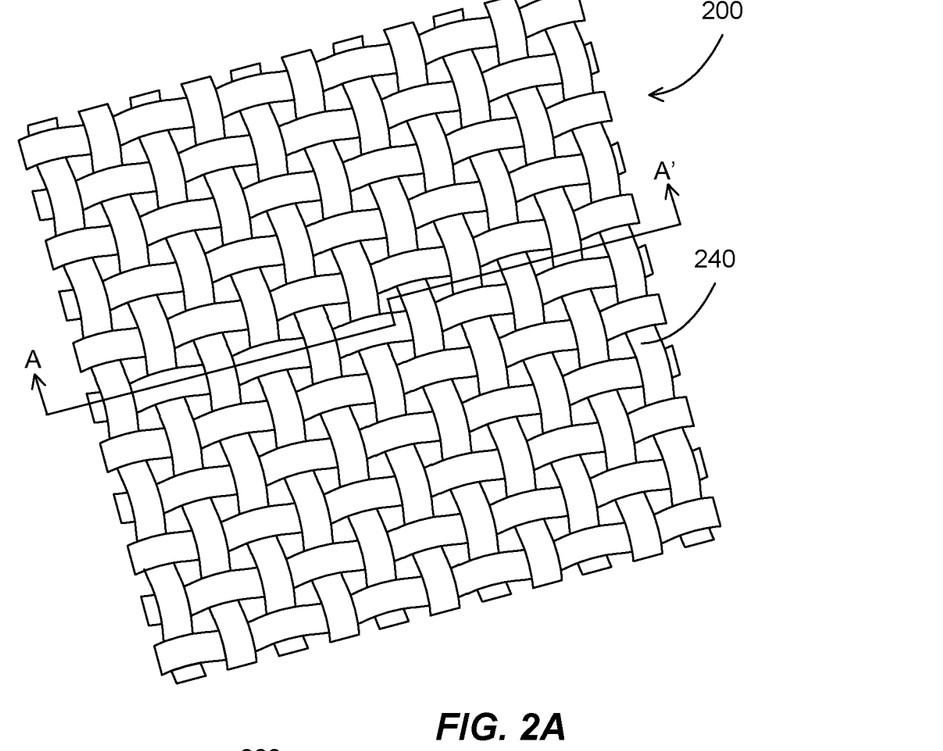
FIGS. 2A-2C illustrate configurations of a heat resistant RFID tag according to some embodiments.

FIGS. 2A-2C illustrate configurations of a heat resistant RFID tag according to some embodiments. In FIG. 2A, an inorganic fiber mesh 200, such as a glass fiber mesh, can include individual fiber strands 240, weaving together to form a mesh. Since glass fiber can have high temperature, high compression and high tension strength, the mesh can provide a thin flexible sheet with high crumbling resistance in a heated environment.

Figure 2B:
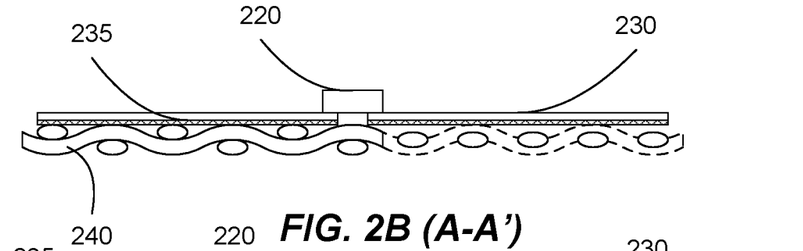

The RFID tag, e.g., an electronic chip 220 connected to an antenna 230, can be disposed directly on the fiber mesh so that the antenna contacts the fiber mesh. An adhesive 235 can be used to coat either the antenna or the fiber mesh, so that the antenna can be bonded to the fiber mesh (FIG. 2B). For example, in the construction of the RFID tag, a sheet of the fiber mesh can be used as a substrate for the RFID tag, eliminating the need for a polymer substrate, in order to protect the RFID tag from high temperature exposure.

Figure 2C:
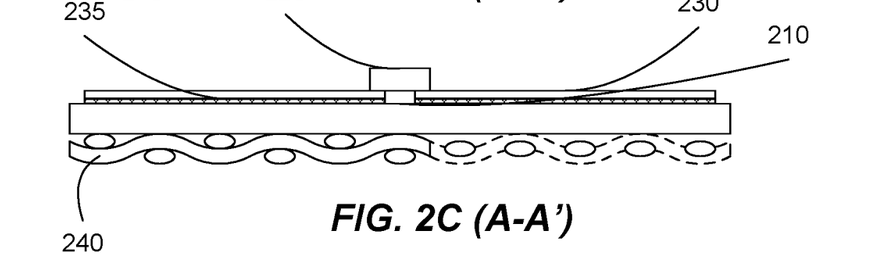

The RFID tag, e.g., an electronic chip 220 connected to an antenna 230 disposed on a substrate 210, can be disposed on the fiber mesh, so that the fiber mesh is coupled to the substrate. An adhesive 235 can be used to coat either the antenna or the fiber mesh, so that the antenna can be bonded to the fiber mesh (FIG. 2C).

In some embodiments, the heat resistant RFID tags can be bonded, or encapsulated in, flexible sheets of glass fibers. The flexible RFID tags can be used in flexible or deformable objects.

In some embodiments, the fiber mesh can take up or compensate for the shrink or warp forces that develop upon heating a polymer material, such as plastic and particular with oriented polymer, due to relaxing the polymers.

Warping can be caused by an uneven temperature distribution, and thus can cause different bending of different areas within the substrate of the RFID tag, which can be made of polyethylene terephthalate (PET) material. In general, the substrate can be warped due to a rapid heating process. For example, the RFID tag can be heated very slowly so that it is always at an even temperature at all points, e.g., at the center as well as at the edges. The substrate can expand in all directions, and if it is not constraint, it does not experience any stresses, and therefore the substrate is not warped.

However, the heating process normally occurs quickly, e.g., the RFID tag can be rapidly exposed to a high temperature. In this case, the heating is not even, for example, the edges can be hotter than the center of the substrate. Further, there can be local heating, for example, due to the non-uniformity of the substrate material, or due to the presence of the RFID chip and the RFID antenna on the substrate.

The outside edges, when heated, will try to expand but are prevented from expanding inwards due to the still-cooled center. The substrate can experience internal stresses, and become more ridged and wrinkled.

The incorporation of the fiber mesh into the substrate can produce a fiber-reinforced substrate, since the fiber strands, such as the glass fiber, can have a much higher tensile and compression strength than the polymeric substrate. The glass fiber strands can have a round shape, which can significantly increase the thickness of the substrate, and which can be beneficial in applications in which thicker RFID tags are desirable. The glass fiber strands can have a flat shape, such as an oval shape or a rectangular shape, which can only slightly increase the thickness of the substrate, and which can be beneficial in applications in which thinner RFID tags are desirable. Also, flat shaped fiber can use a smaller amount of adhesive, such as high temperature adhesive for bonding the fiber mesh to the substrate. Further, flat shaped fiber can allow more reinforced fiber within a certain thickness of the RFID tags, which can lead to higher heat resistant RFID tags.

Figure 3A:
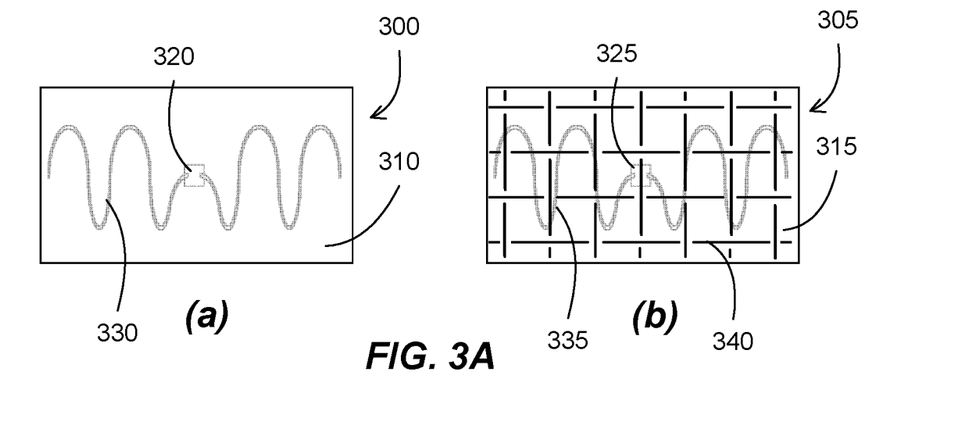
FIGS. 3A-3C illustrate thermal responses of an RFID tag and an RFID tag having a glass fiber mesh reinforcement according to some embodiments.
Figure 3B:
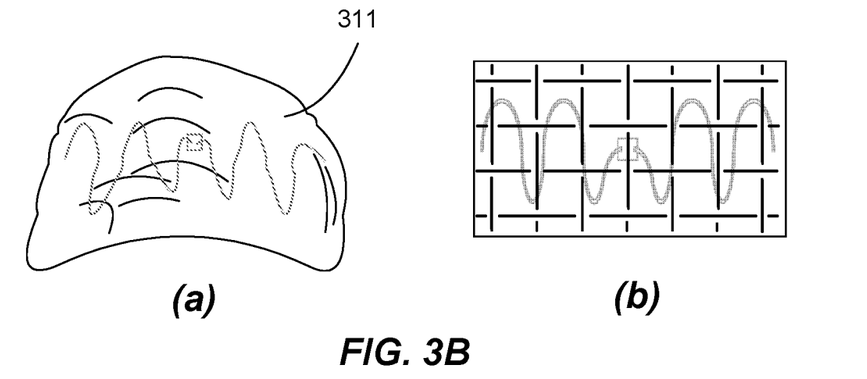
Figure 3C:
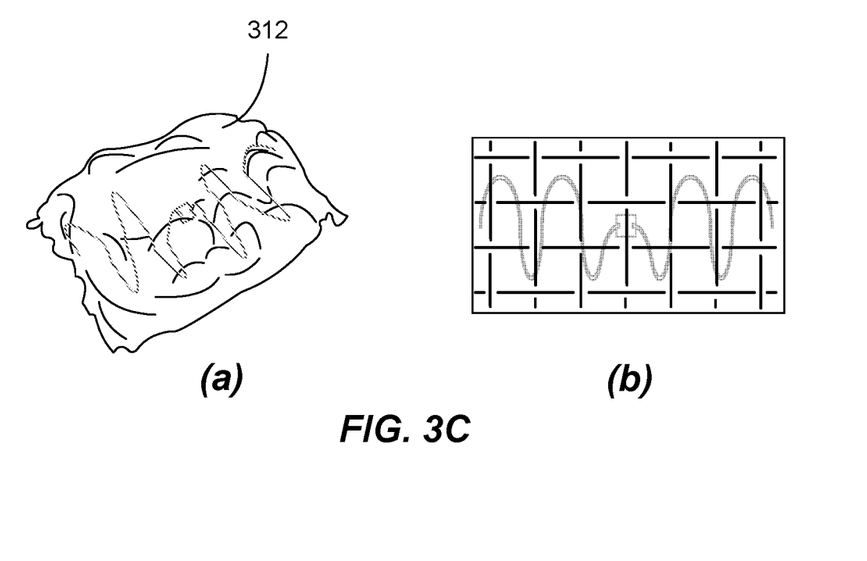

FIGS. 3A-3C illustrate thermal responses of an RFID tag and an RFID tag having a glass fiber mesh reinforcement according to some embodiments. FIGS. 3A(a), 3B(a), and 3C(a) show a thermal response of an RFID tag. FIGS. 3A(b), 3B(b), and 3C(b) show a thermal response of an RFID tag having a glass fiber mesh reinforcement.

FIGS. 3A(a) and 3A(b) show an RFID tag 300 and an RFID tag 305 having a fiber mesh reinforcement. The RFID tag 300 can include an RFID chip 320 coupled to an RFID antenna 330, disposed on a polymer substrate 310 such as a PET substrate. The RFID tag 305 can include an RFID chip 325 coupled to an RFID antenna 335, disposed on a polymer substrate 315 such as a PET substrate. The substrate 315 can be reinforced with a fiber mesh 340, such as a glass fiber mesh.

FIGS. 3B(a) and 3B(b) show the RFID tags 300 and 305 after subjected to a temperature environment of 210 C for 90 seconds. The RFID tag 300 can be warped, e.g., the substrate 310 can become warped, forming a warped substrate 311. The RFID tag 305 can still keeping its shape, e.g., the substrate 305 is still flat and not shrink or warped.

FIGS. 3C(a) and 3C(b) show the RFID tags 300 and 305 after subjected to a temperature environment of 210 C for 3 minutes. The RFID tag 300 can be further warped, forming a severe warped substrate 312. The RFID tag 305 can still keeping its shape, e.g., the substrate 305 is still flat and not shrink or warped.

Figure 4A:
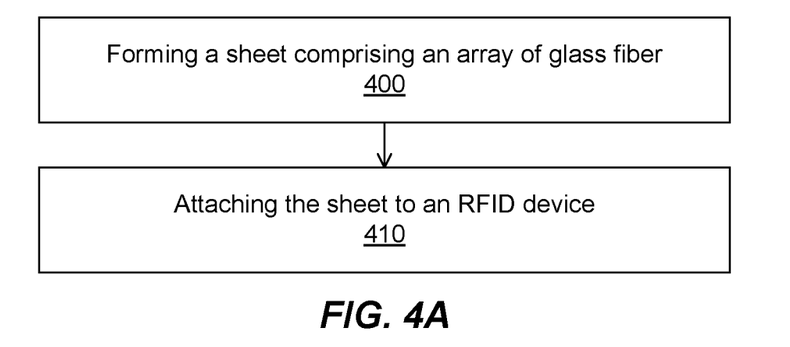
FIGS. 4A-4D illustrate flow charts for processing heat resistant RFID tags according to some embodiments.

FIGS. 4A-4D illustrate flow charts for processing heat resistant RFID tags according to some embodiments. In FIG. 4A, operation 400 forms a sheet comprising an array of glass fiber. The array of glass fiber can have fiber strands arranged in different directions, such as forming a mesh, to protect the sheet from being crumbled in one direction. The sheet can be configured to be heat resistant, e.g., to block a heat flux and to provide a high temperature gradient when exposed to a high temperature environment. For example, the glass fibers can be weaved tightly with minimum or no gaps in between the glass fiber strands, to block hot gas from passing through the sheet.

Alternatively, the glass fibers can be arranged with gaps between the fiber strands, such as in a loose weaving configuration or in a random configuration. A high temperature adhesive, such as an adhesive cement or an inorganic based adhesive, can be used to fill the gaps between the fiber strands.

The glass fiber can be coated with a layer of adhesive, or can be embedded in a layer of adhesive. The adhesive can be configured to provide a flexible sheet of glass fiber, such as to use a minimum amount of adhesive, or to use flexible adhesive, e.g., adhesive that is still flexible after drying.

Operation 410 couples the sheet to an RFID device, e.g., either the sheet is attached to an RFID tag, or the RFID tag is attached to the sheet. The RFID tag can include the electronic chip connected to the antenna, e.g., without a substrate. Thus the sheet can be used as a substrate for the RFID tag. The sheet can be disposed next to the antenna, with the chip on an opposite side of the antenna. The sheet can be disposed next to the antenna, with the chip between the antenna and the sheet. An adhesive layer can be used for attaching the antenna to the sheet. The adhesive can be a high temperature adhesive.

The RFID tag can include the electronic chip connected to the antenna disposed on a substrate. The sheet can be disposed next to the substrate, with the chip and the antenna on an opposite side of the substrate. The sheet can be disposed next to the substrate, with the chip and the antenna between the substrate and the sheet. An adhesive layer can be used for attaching the substrate to the sheet. The adhesive can be a high temperature adhesive.

In some embodiments, the RFID tag, together with the fiber sheet, can be attached to an object, for example, to track the object. The sheet can be positioned outside of the RFID tag, e.g., the RFID tag can be disposed between the sheet and the object surface. Thus, the sheet can shield the RFID tag from incoming heat flux. This configuration can be used for low temperature object, e.g., object that still has a low temperature even with high heat exposure, such as objects that have short term heat exposure, or objects with low thermal conduction.

For object that can be hot after a heat exposure, e.g., objects that have long term heat exposure, or objects with high thermal conduction, the sheet can be positioned between the RFID tag and the object surface. Thus, the sheet can shield the RFID tag from high temperature heat flux coming from the object. This configuration can be used for low temperature environment and high temperature object, such as objects that are heated directly in a low temperature ambient.

Alternatively, the RFID tag can be embedded between two sheets of fiber mesh, thus the RFID tag can be protected from all directions.

Figure 4B:
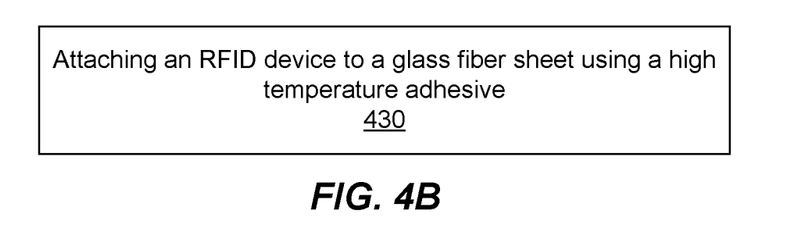

In FIG. 4B, operation 430 attaches an RFID device to a glass fiber sheet using a high temperature adhesive. The high temperature adhesive can be selected based on the applications, e.g., the environment in which the RFID tag can be exposed to. For example, for a medium temperature exposure, such as less than 500 C, less than 400 C, or less than 300 C, the high temperature adhesive can include a polymer-based adhesive, which can sustain a temperature of 500 C or less. The polymer-based adhesive can also include inorganic elements, for example, to increase the operating temperature of the adhesive. For high temperature exposure, such as less than 2000 C, less than 1500 C, or less than 1000 C, the high temperature adhesive can include an inorganic-based or ceramic-based adhesive. The high temperature adhesive can include cement adhesive. The high temperature adhesive can include a mixture of polymer and inorganic elements.

In some embodiments, the high temperature adhesive can be selected to be flexible after curing. Alternatively, the high temperature adhesive can be applied in such as thin layer to allow the final RFID tag, e.g., the heat resistant RFID tag, to sustain the desired operating temperature while maintaining the required flexibility of the application.

Figure 4C:
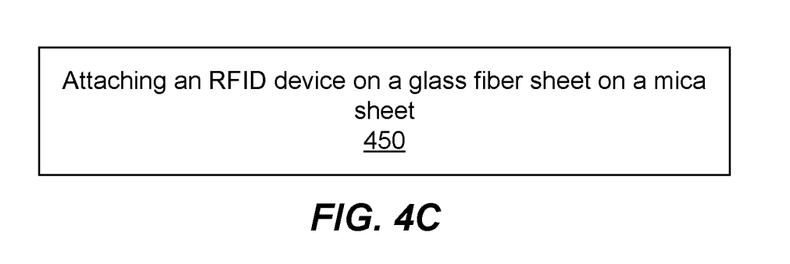

In FIG. 4C, operation 450 attaches an RFID device on a glass fiber sheet on a mica sheet. An inorganic sheet, such as a mica sheet, can be used in addition to the glass fiber mesh. The mica sheet can provide an overall heat protection, especially in gaps between the fiber strands in the fiber mesh. The fiber mesh can provide a crumbling resistance, essentially keeping the mica sheet in flat configuration even in high heat applications.

In some embodiments, the mica sheet thickness can be less than a few hundreds of microns, such as less than 200 microns, less than 100 microns, or less than 50 microns. The fiber strand diameter can also be less than a few hundreds of microns, such as less than 100 microns, less than 50 microns, less than 40 microns, less than 30 microns, or less than 20 microns.

In some embodiments, a layer of high temperature adhesive can be applied between the fiber mesh and the mica sheet. The adhesive layer thickness can be less than 100 microns, less than 50 microns, or less than 30 microns.

In some embodiments, the heat protection laminate of a glass fiber mesh and a mica sheet can be applied to one side of the RFID tag. For example, the heat resistant RFID device can include an electronic chip, connected with an antenna, with the chip and the antenna disposed on a glass fiber sheet on a mica sheet. The heat resistant RFID device can include an electronic chip, connected with an antenna, with the chip and the antenna disposed on a substrate on a glass fiber sheet on a mica sheet. The heat resistant RFID device can include an electronic chip and an antenna disposed on a mica sheet on a glass fiber sheet. The heat resistant RFID device can include an electronic chip and an antenna disposed on a substrate on a mica sheet on a glass fiber sheet. Adhesive layers can be used to bond the layers together.

In some embodiments, the heat protection laminate of a glass fiber mesh and a mica sheet can be applied to both sides of the RFID tag. For example, the heat resistant RFID device can include an electronic chip, connected with an antenna, with the chip and the antenna embedded between two composite layers of a glass fiber sheet and a mica sheet. A composite layer can include a glass fiber mesh on a mica sheet, or a mica sheet on a glass fiver mesh. Adhesive layers can be used to bond the layers together.

Figure 4D:
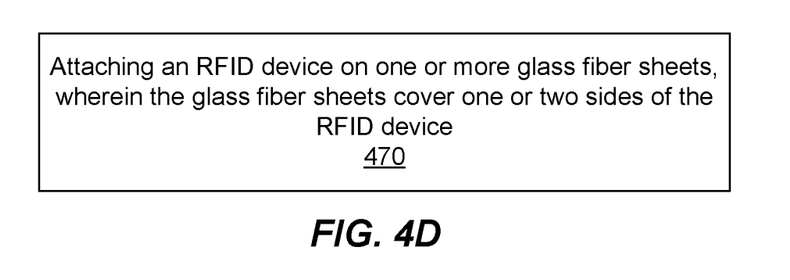

In FIG. 4D, operation 470 couples an RFID device on one or more glass fiber sheets, wherein the glass fiber sheets cover one or two sides of the RFID device. The glass fiber sheet can include a glass fiber mesh, together with optional high temperature adhesive for blocking the gaps between the fibers. The amount of adhesive can be minimal, such as enough to fill the gaps without thickening the thickness of the fiber mesh. The adhesive can also slightly cover the fiber mesh, e.g., thickening the thickness of the fiber mesh. The glass fiber sheet can include a glass fiber mesh embedded in a layer of high temperature adhesive. The adhesive usage can depend on the applications of the heat resistant RFID tags. For example, for applications requiring a flexible RFID tag, the amount of adhesive can be minimal, or the adhesive material can be selected to remain flexible after curing.

The heat resistant RFID tags can sustain high temperature up to 250 C for 48-200 hours. The glass fiber mesh can have uniform dielectric, low power loss, and stable capacitance values, which can contribute to maintain the RF performance of the RFID tags.

FIGS. 5A-5F illustrate configurations for glass fiber meshes according to some embodiments. Glass fibers can sustain high temperature applications, together with high tension and compression along the length of the fibers. Thus, a fiber mesh, which includes fibers arranged in different directions, can provide protection against high thermal fluxes, which can cause the RFID tags to crumble before being burned.

The selection of the fiber mesh configurations can base on the high temperature applications. For example, if the RFID tag is unlikely to be crumble in one direction, the fiber mesh can have reduced protection along that direction. In general, a square mesh can provide adequate protection in all directions. For high protection, polygonal meshes can be used. The fiber mesh can form a reinforcement backbone, which can take up or compensate for the shrink or warp forces caused by heating the RFID tags on which the fiber mesh is bonded to. Due to the high tensile and compression strength of the fiber strands, the fiber mesh can resist significantly the shrink or warp forces on a polymer or plastic substrate of the RFID tags.

Figure 5A:
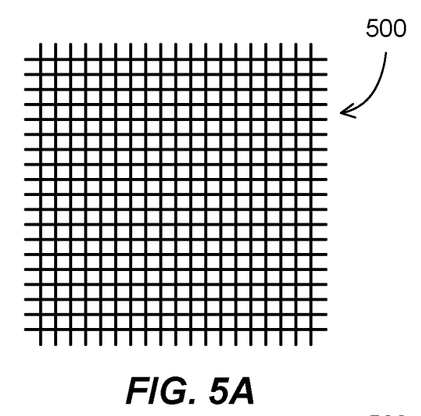
FIGS. 5A-5F illustrate configurations for glass fiber meshes according to some embodiments.

FIG. 5A shows a tight mesh 500, e.g., a mesh in which the fibers can be placed next to each other, such as a tightly woven mesh, or a mesh having closely arranged fibers. The tight mesh configuration can significantly reduce air gaps between the fibers, which can serve to effectively block any passing heat flux. Thus, the tight mesh configuration can be used alone for protecting the RFID tag. The tight mesh configuration can also reduce an amount of adhesive, for example, when the fiber mesh is bonded to a mica sheet, or to the RFID antenna.

Figure 5B:
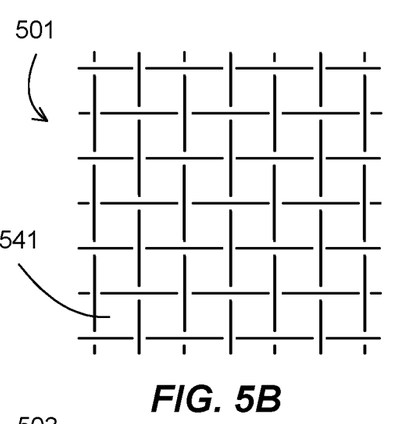

FIG. 5B shows a woven loose mesh 501, e.g., a mesh in which the fibers can be placed farther apart, leaving gaps 541 between the strands of the glass fibers. High temperature adhesive can be used to fill the gaps. The loose mesh configuration can serve as a reinforced backbone, to prevent the adhesive, or an optional mica sheet adhering to the loose fiber mesh, from being crumbled.

Figure 5C:
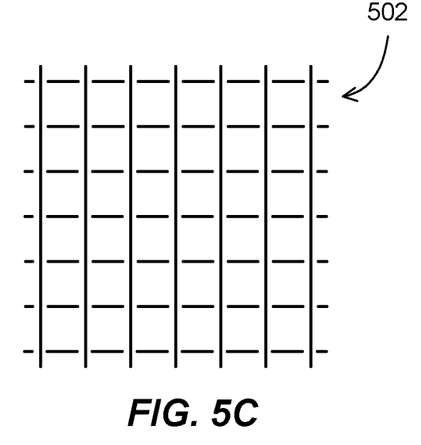

FIG. 5C shows a loose mesh 502 in which the fiber strands in one direction are placed on top the fiber strands in another direction. Adhesive can be used to keep the fiber strands in the mesh configuration.

Figure 5D:
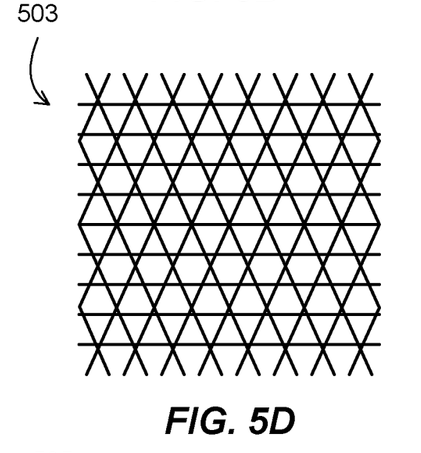

FIG. 5D shows a mesh 503 in which the fiber strands are arranged in three directions. This configuration can provide higher crumble resistant to the heat protection sheet employing the fiber mesh.

Figure 5E:
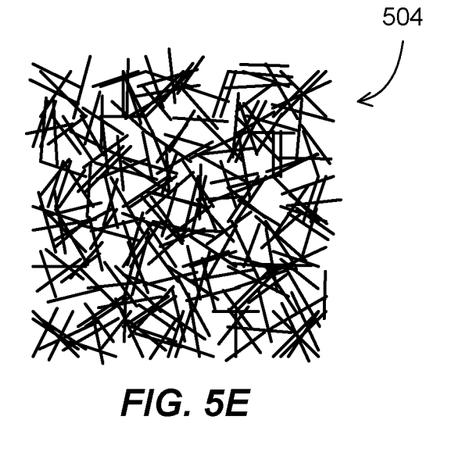

FIG. 5E shows a mesh in random directions, e.g., short fiber strands can be arranged in a random fashion. Adhesive can be used to keep the fiber strands in the random configuration.

Figure 5F:
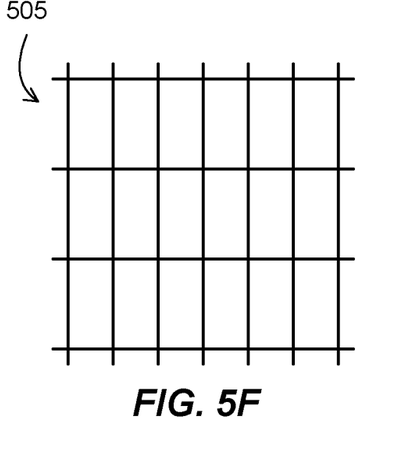

FIG. 5F shows a mesh in which there are more fiber strands in one direction as compared to another direction. Higher crumble resistance can be expected along the direction of more fiber strands. Other mesh configurations can also be used, such as woven meshes in which one strand can be under more than one strand in the other direction, or meshes with the fiber strands arranged in more than three directions.

Figures 6A, 6B, 6C, 6D:
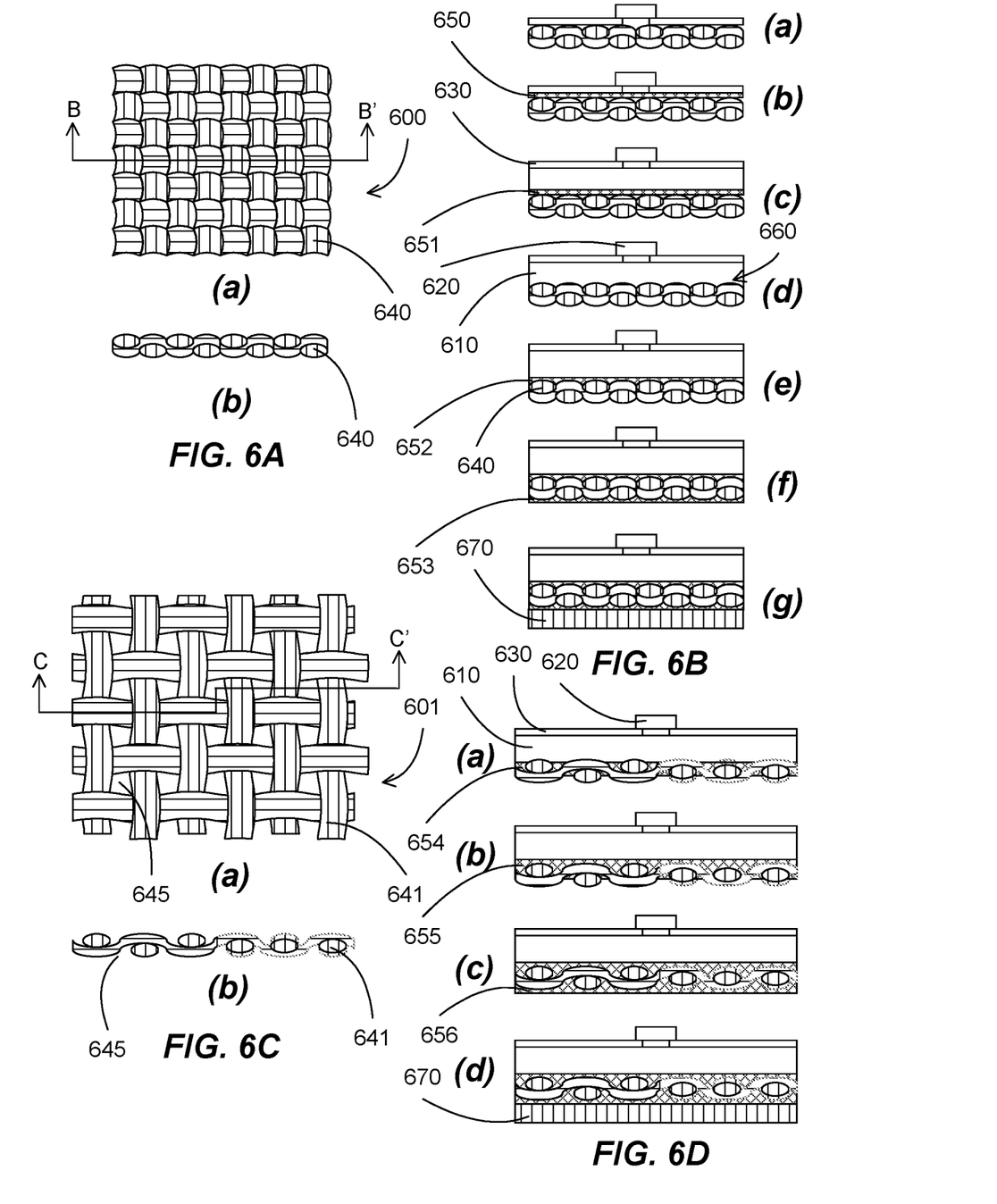
FIGS. 6A-6D illustrate configurations of a heat resistant RFID tag according to some embodiments.

FIGS. 6A-6D illustrate configurations of a heat resistant RFID tag according to some embodiments. FIGS. 6A(a) and 6A(b) show a top view and a cross section of a tightly woven fiber mesh 600, with the fiber strands 640 are woven next to each other with essentially no gaps in between. FIGS. 6B(a)-6B(g) show configurations in which the tightly woven fiber mesh 600 can be used for heat protecting an RFID device of an RFID chip 620 connected to an RFID antenna 630.

In FIG. 6B(a), the RFID device can be placed directly on the fiber mesh. An adhesive can be applied to the antenna to secure the RFID on the fiber mesh. In FIG. 6B(b), an adhesive layer 650 can be applied between the fiber mesh and the antenna. The adhesive layer can be a high temperature adhesive layer for more heat protection, or a low temperature adhesive layer if the additional heat protection from the high temperature adhesive layer is not needed.

In FIG. 6B(c), the RFID device can include a substrate 610, e.g., the RFID device can include an RFID chip 620 connected to an RFID antenna 630 disposed on the substrate 610. The fiber mesh can compensate for the shrink or warp forces caused by heating the RFID tag, e.g., the shrink or warp forces on the substrate of the RFID tag. An adhesive layer 651 can be applied to the substrate, before pressing the fiber mesh onto the substrate to secure the fiber mesh to the substrate. The adhesive layer can be a high temperature adhesive layer or a low temperature adhesive layer. In FIG. 6B(d), the fiber mesh can be pressed 660 onto the substrate for bonding with the substrate. The fiber mesh can be heated before pressing, to provide a better bonding.

In FIG. 6B(e), an adhesive layer 652 can be applied to the fiber mesh, with some force to allow the adhesive to penetrate the fiber strands, before pressing the fiber mesh onto the substrate to secure the fiber mesh to the substrate. In FIG. 6B(f), the fiber mesh can be embedded between layers 653 of adhesive. For example, a top adhesive layer can be coated on a top side of the fiber mesh. A bottom adhesive layer can be coated on a bottom side of the fiber mesh. The bottom side adhesive can be a high temperature adhesive, since this adhesive layer can be exposed to a high temperature ambient.

In FIG. 6B(g), a mica sheet 670 can be used together with the fiber mesh. As shown, the fiber mesh is disposed between the RFID device and the mica sheet. Other configurations can be used, such as the mica sheet is disposed between the RFID device and the fiber mesh, or the mica sheet can be used to replace the substrate. Adhesive layers can be applied to both sides of the fiber mesh for bonding the fiber mesh with the RFID device and with the mica sheet.

FIGS. 6C(a) and 6C(b) show a top view and a cross section of a loosely woven fiber mesh 601, with the fiber strands 641 are woven with gaps 645 in between. FIGS. 6C(a)-6C(d) show configurations in which the woven fiber mesh 601 can be used for heat protecting an RFID device of an RFID chip 620 connected to an RFID antenna 630.

In FIG. 6D(a), the RFID device can include a substrate 610, e.g., the RFID device can include an RFID chip 620 connected to an RFID antenna 630 disposed on the substrate 610. The fiber mesh can strengthen the substrate of the RFID tag, to resist the shrink or warp forces caused by heating the RFID tag. An adhesive layer 654 can be applied to the fiber mesh, before bonding the fiber mesh onto the substrate to secure the fiber mesh to the substrate. The adhesive amount can be minimal, e.g., enough to fill the gaps between the fibers, but not enough to coat the fiber mesh with a layer of adhesive.

In FIG. 6D(b), an adhesive layer 655 can be applied to the fiber mesh, filling the gaps between the fibers and coating the fiber with a layer of adhesive. In FIG. 6D(c), the fiber mesh can be embedded between layers 656 of adhesive. For example, a top adhesive layer can be coated on a top side of the fiber mesh. A bottom adhesive layer can be coated on a bottom side of the fiber mesh.

In FIG. 6D(d), a mica sheet 670 can be used together with the fiber mesh. As shown, the fiber mesh is disposed between the RFID device and the mica sheet. Other configurations can be used, such as the mica sheet is disposed between the RFID device and the fiber mesh, or the mica sheet can be used to replace the substrate. Adhesive layers can be applied to both sides of the fiber mesh for bonding the fiber mesh with the RFID device and with the mica sheet.

The adhesive layer can be a high temperature adhesive layer or a low temperature adhesive layer.

Figures 7A, 7B, 7C, 7D:
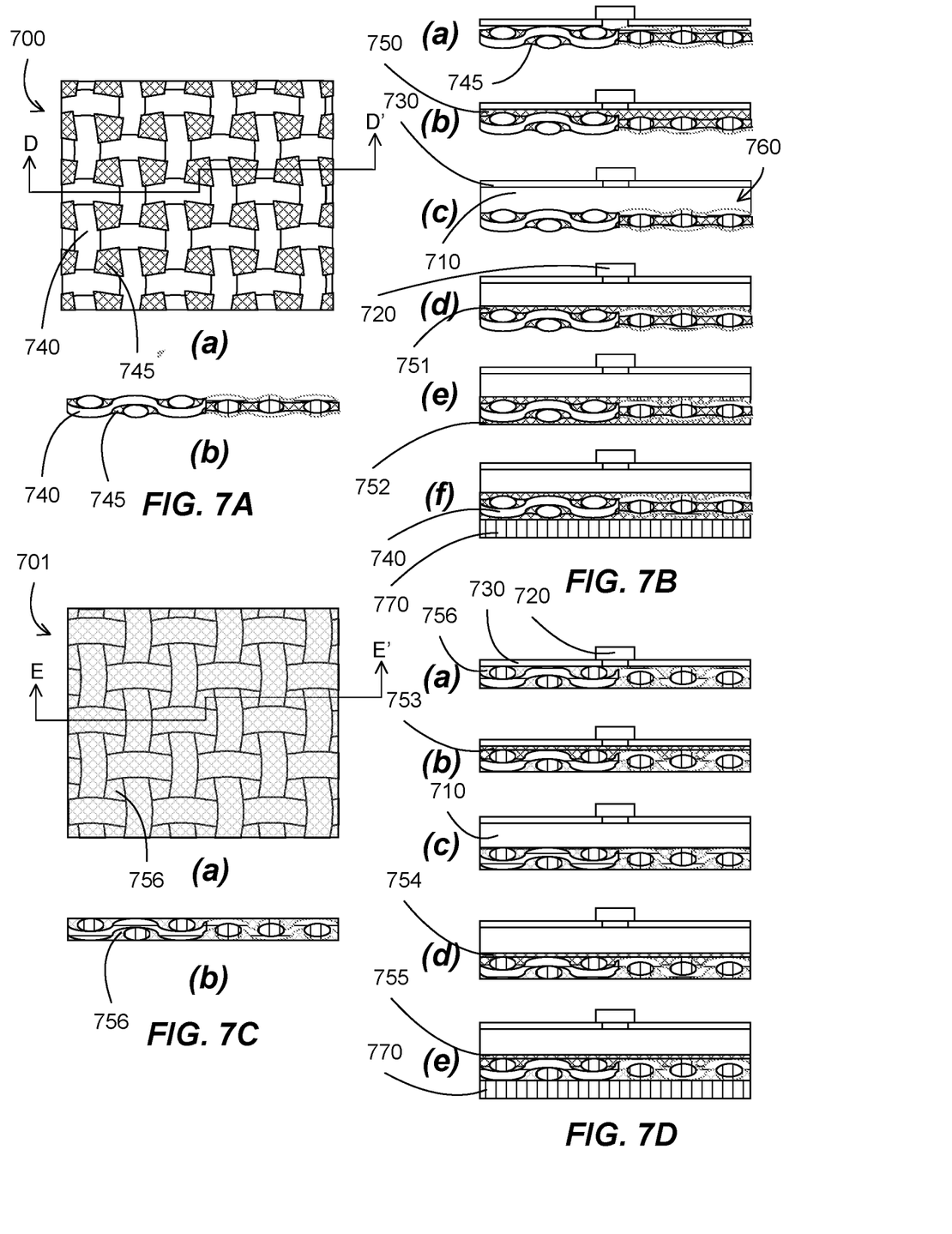
FIGS. 7A-7D illustrate configurations of a heat resistant RFID tag according to some embodiments.

FIGS. 7A-7D illustrate configurations of a heat resistant RFID tag according to some embodiments. FIGS. 7A(a) and 7A(b) show a top view and a cross section of a loosely woven fiber mesh 700, with the fiber strands 740 are woven with gaps in between and with the gaps filled with a high temperature adhesive. FIGS. 7B(a)-7B(f) show configurations in which the woven fiber mesh 700 can be used for heat protecting an RFID device of an RFID chip 720 connected to an RFID antenna 730.

In FIG. 7B(a), the RFID device can be placed directly on the fiber mesh. An adhesive can be applied to the antenna to secure the RFID on the fiber mesh. In FIG. 7B(b), an adhesive layer 750 can be applied between the fiber mesh and the antenna. The adhesive layer can be a high temperature adhesive layer for more heat protection, or a low temperature adhesive layer if the additional heat protection from the high temperature adhesive layer is not needed.

In FIG. 7B(c), the fiber mesh can be pressed 760 onto the substrate for bonding with the substrate. The fiber mesh can strengthen the substrate, e.g., increasing the heat resistance of the RFID tag. The fiber mesh can be heated before pressing, to provide a better bonding. In FIG. 7B(d), an adhesive layer 751 can be applied to the fiber mesh, with some force to allow the adhesive to penetrate the fiber strands, before pressing the fiber mesh onto the substrate to secure the fiber mesh to the substrate.

In FIG. 7B(e), the fiber mesh can be embedded between layers 752 of adhesive. For example, a top adhesive layer can be coated on a top side of the fiber mesh. A bottom adhesive layer can be coated on a bottom side of the fiber mesh. The bottom side adhesive can be a high temperature adhesive, since this adhesive layer can be exposed to a high temperature ambient. In FIG. 7B(f), a mica sheet 770 can be used together with the fiber mesh. As shown, the fiber mesh is disposed between the RFID device and the mica sheet. Other configurations can be used, such as the mica sheet is disposed between the RFID device and the fiber mesh, or the mica sheet can be used to replace the substrate. Adhesive layers can be applied to both sides of the fiber mesh for bonding the fiber mesh with the RFID device and with the mica sheet.

FIGS. 7C(a) and 7C(b) show a top view and a cross section of a woven fiber mesh 701, which is embedded in a layer of adhesive. FIGS. 7C(a)-7C(e) show configurations in which the woven fiber mesh 701 can be used for heat protecting an RFID device of an RFID chip 720 connected to an RFID antenna 730.

In FIG. 7D(a), the RFID device can be placed directly on the fiber mesh. An adhesive can be applied to the antenna to secure the RFID on the fiber mesh. In FIG. 7D(b), an adhesive layer 753 can be applied between the fiber mesh and the antenna. The adhesive layer can be a high temperature adhesive layer for more heat protection, or a low temperature adhesive layer if the additional heat protection from the high temperature adhesive layer is not needed.

In FIG. 7D(c), the fiber mesh can be pressed 760 onto the substrate for bonding with the substrate. The fiber mesh can strengthen the substrate, e.g., increasing the heat resistance of the RFID tag. The adhesive 756 on the fiber mesh can be used to bond the fiber mesh with the substrate. In FIG. 7D(d), an adhesive layer 754 can be applied to the fiber mesh, to bond the fiber mesh to the substrate.

In FIG. 7D(e), a mica sheet 770 can be used together with the fiber mesh. As shown, the fiber mesh is disposed between the RFID device and the mica sheet. Other configurations can be used, such as the mica sheet is disposed between the RFID device and the fiber mesh, or the mica sheet can be used to replace the substrate. Adhesive layers can be applied to both sides of the fiber mesh for bonding the fiber mesh with the RFID device and with the mica sheet.

The adhesive layer can be a high temperature adhesive layer or a low temperature adhesive layer.

Figure 8A:
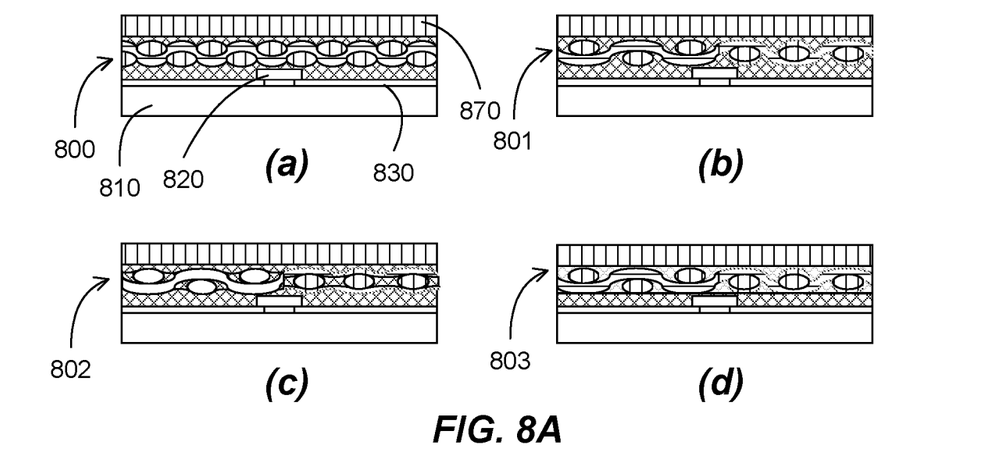
FIGS. 8A-8B illustrate configurations of a heat resistant RFID tag according to some embodiments.
Figure 8B:
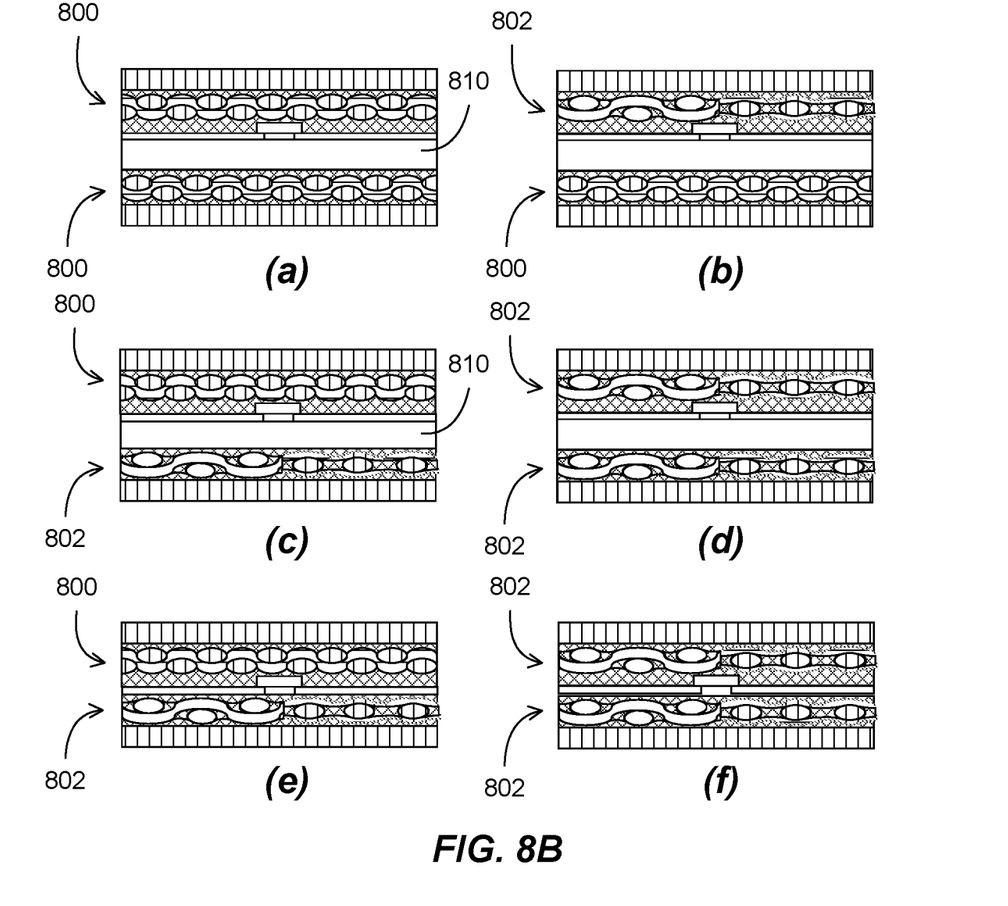

FIGS. 8A-8B illustrate configurations of a heat resistant RFID tag according to some embodiments. FIGS. 8A(a)-8A(d) show configurations in which the fiber mesh is disposed on top of the RFID device, e.g., the RFID chip 820 is embedded between the antenna 830 (or the substrate 810) and the fiber mesh. FIGS. 8B(a)-8B(f) show configurations in which the fiber mesh is disposed on both sides of the RFID device, e.g., the RFID chip is embedded between two layers of fiber meshes.

In FIG. 8A(a), a mica sheet 870 can be used together with a tightly woven fiber mesh 800, which can be embedded in an adhesive layer. In FIG. 8A(b), a mica sheet 870 can be used together with a loosely woven fiber mesh 801, which can be embedded in an adhesive layer. In FIG. 8A(c), a mica sheet 870 can be used together with a loosely woven fiber mesh 802 having gaps filled with an adhesive and which can be embedded in an adhesive layer. In FIG. 8A(d), a mica sheet 870 can be used together with a loosely woven fiber mesh 803 which can be embedded in an adhesive layer.

As shown, the fiber mesh is disposed between the RFID device and the mica sheet. Other configurations can be used, such as the mica sheet is disposed between the RFID device and the fiber mesh, or the mica sheet can be used to replace the substrate. Adhesive layers can be applied to both sides of the fiber mesh for bonding the fiber mesh with the RFID device and with the mica sheet.

In FIG. 8B(a), a heat resistant RFID tag with a substrate can be disposed between two composite layers of tightly woven fiber meshes 800 and mica sheets. In FIG. 8B(b), a heat resistant RFID tag with a substrate can be disposed between a composite layer of a tightly woven fiber mesh 800 and a mica sheet, and another composite layer of a loosely woven fiber mesh 802 and a mica sheet, with the tightly woven fiber mesh in a bottom side toward the substrate.

In FIG. 8B(c), a heat resistant RFID tag with a substrate can be disposed between a composite layer of a tightly woven fiber mesh 800 and a mica sheet, and another composite layer of a loosely woven fiber mesh 802 and a mica sheet, with the tightly woven fiber mesh in a top side toward the RFID chip. In FIG. 8B(d), a heat resistant RFID tag with a substrate can be disposed between two composite layers of loosely woven fiber meshes 802 and mica sheets.

In FIG. 8B(e), a heat resistant RFID tag without a substrate can be disposed between a composite layer of a tightly woven fiber mesh 800 and a mica sheet, and another composite layer of a loosely woven fiber mesh 802 and a mica sheet, with the tightly woven fiber mesh in a top side toward the RFID chip. In FIG. 8B(f), a heat resistant RFID tag without a substrate can be disposed between two composite layers of loosely woven fiber meshes 802 and mica sheets.

Other configurations can also be used.

In some embodiments, the present invention discloses methods to form heat resistant RFID tag. An RFID device can be coupled to one or more fiber meshes, using high temperature adhesive. Optional mica sheet can also be used, to increase the heat resistance with minimum changes in the overall thickness of the RFID tag. The RFID device can be coupled to a fiber mesh at one side, such as at the substrate side or at the RFID chip side. The RFID device can be embedded between two meshes of glass fibers.

Figure 9A:
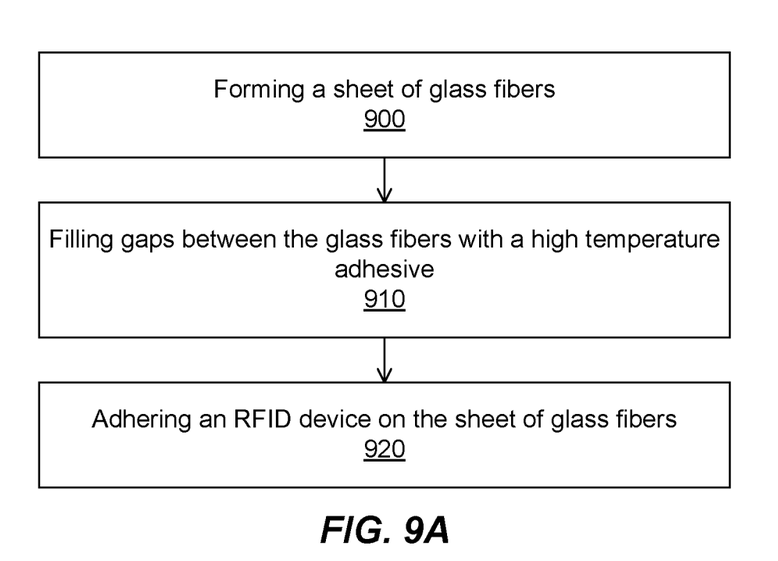
FIGS. 9A-9B illustrate flow charts for forming heat resistant RFID devices according to some embodiments.

FIGS. 9A-9B illustrate flow charts for forming heat resistant RFID devices according to some embodiments. In FIG. 9A, operation 900 forms a sheet of glass fibers. The glass fibers can be woven, such as tightly woven without or with minimum gaps between the fibers. The glass fibers can be woven loosely.

The fibers can be woven in a conventional way, e.g., each fiber strand is alternatively positioned above and below two successive cross fiber strands. Other weaving process can also be used, such as each fiber strand is alternatively positioned above more than one successive cross fiber strand, followed by positioned below more than one successive cross fiber strand.

Further, the fibers can be woven so that there are more fiber strands in one direction as compared to another direction. The fibers can be woven in more than two directions. The fibers can be placed on top of each other in an orderly fashion. The fibers can be placed randomly.

Operation 910 fills gaps between the glass fibers with a high temperature adhesive. The gaps between the loosely woven fibers can be filled with a high temperature adhesive. The adhesive can be configured to fill the gaps without thickening the thickness of the woven fiber mesh. The adhesive can be configured to fill the gaps together with forming a layer on one side of the woven fiber mesh. The adhesive can be configured to fill the gaps together with forming layers on both sides of the woven fiber mesh, e.g., the fiber mesh is embedded in the adhesive layer. The adhesive amount can be selected to provide a flexible sheet of fiber mesh with adhesive.

Operation 920 couples an RFID device on the sheet of glass fibers. The RFID device can be with or without a substrate. The RFID antenna can have a coating of adhesive, in order to be bonded to the sheet of glass fiber mesh, in case of no substrate RFID device. The RFID device can be coupled to the sheet of glass fibers in either direction, e.g., on top of the RFID device or at a bottom side of the RFID device. Alternatively, two sheets of glass fibers can be used for embedding the RFID device. Mica sheets can be coupled to the glass fiber sheet, with or without a high temperature adhesive layer.

Figure 9B:
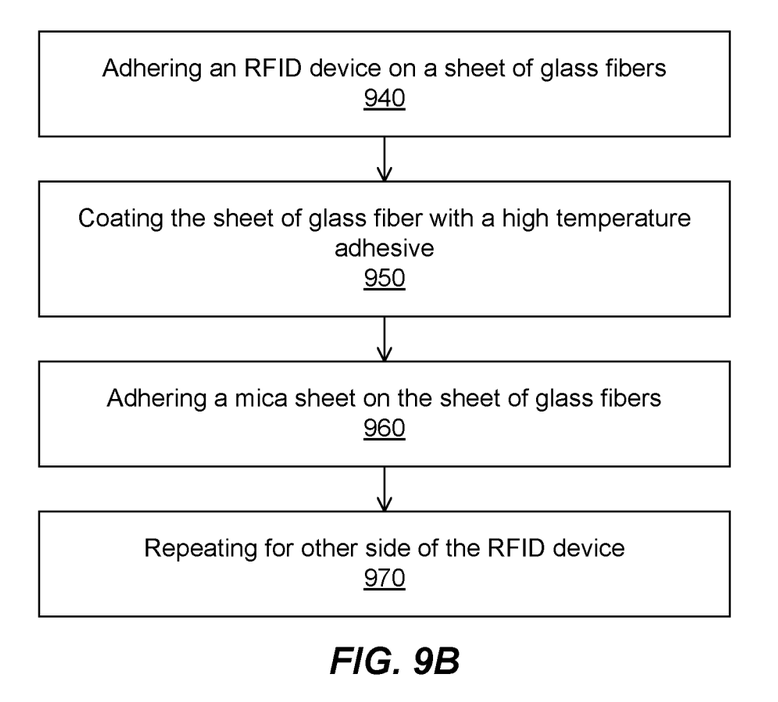

In FIG. 9B, operation 940 couples an RFID device on a sheet of glass fibers. Operation 950 coats the sheet of glass fiber with a high temperature adhesive. Operation 960 couples a mica sheet on the sheet of glass fibers. Operation 970 repeats for other side of the RFID device.

What is claimed is:

1. A heat resistant RFID tag comprising
   at least one sheet of meshed inorganic fibers, the spacing between the inorganic fibers selected to reduce air gaps and block heat flux through the at least one sheet,
   a Radio Frequency Identification (RFID) device including a polymer substrate adhered on the at least one sheet,
   wherein the inorganic fibers are selected and configured to provide a reinforcement backbone to the polymer substrate of the RFID device reinforcing the tensile and compression strength and compensating for shrink or warping forces on the polymer substrate.

2. The heat resistant RFID tag as in claim 1 wherein the at least one sheet comprises glass fibers, and wherein the glass fibers are at least one of round, flat and oval.

3. The heat resistant RFID tag as in claim 1 wherein the inorganic fibers comprise at least one of carbon fibers, silicate fibers, ceramic fibers, aluminum silicate fibers, and basalt fibers.

4. The heat resistant RFID tag as in claim 1 wherein the mesh comprises a polygonal mesh.

5. The heat resistant RFID tag as in claim 1 further comprising a mica sheet adhered to the at least one sheet of meshed inorganic fibers.

6. A heat resistant RFID tag comprising
   a sheet comprising a mesh of glass fibers, the fibers extending in a plurality of directions, an adhesive layer coated on the sheet,
   a Radio Frequency Identification (RFID) device including a polymer substrate coupled on the adhesive layer, wherein the glass fibers and the adhesive layer are configured to provide a reinforcement backbone to the adhesive and the polymer substrate of the RFID device reinforcing the tensile and compression strength and compensating for shrink or warping forces on the substrate, and a mica sheet coupled to the sheet on a side opposite the RFID device.

7. The heat resistant RFID tag as in claim 6 wherein the mesh is woven loosely to provide a reinforcing backbone to the adhesive coating that fills gaps between the glass fibers.

8. The heat resistant RFID tag as in claim 6 wherein the mesh is woven tightly to prevent air gaps and the adhesive coating covers the mesh of glass fibers.

9. The heat resistant RFID tag as in claim 6 further comprising a second sheet comprising a mesh of glass fibers, wherein the second sheet is coupled to an opposing side of the RFID device from the sheet so that the RFID device is embedded between the sheet and the second sheet.

10. The heat resistant RFID tag as in claim 6, wherein the adhesive layer fills gaps in the sheet without thickening the sheet.

* * * * *